(12) United States Patent
Toy

(10) Patent No.: US 7,331,377 B1
(45) Date of Patent: Feb. 19, 2008

(54) DIAMOND FOAM SPRAY COOLING SYSTEM

(75) Inventor: Ben K. Toy, San Mateo, CA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 47 days.

(21) Appl. No.: 11/046,657

(22) Filed: Jan. 28, 2005

Related U.S. Application Data

(60) Provisional application No. 60/540,921, filed on Jan. 30, 2004.

(51) Int. Cl.
*H05K 7/20* (2006.01)

(52) U.S. Cl. ............ 165/80.4; 165/903; 165/907; 165/908; 257/714; 257/715; 361/699; 361/700

(58) Field of Classification Search .......... 165/907, 165/908, 80.4, 903; 257/714, 715; 361/699, 361/700
See application file for complete search history.

(56) References Cited

U.S. PATENT DOCUMENTS

| | | | | |
|---|---|---|---|---|
| 4,201,195 A | * | 5/1980 | Sakhuja | 126/675 |
| 4,352,392 A | | 10/1982 | Eastman | 165/104.25 |
| 4,879,632 A | * | 11/1989 | Yamamoto et al. | 361/720 |
| 4,949,164 A | * | 8/1990 | Ohashi et al. | 257/715 |
| 5,150,274 A | * | 9/1992 | Okada et al. | 361/703 |
| 5,168,348 A | * | 12/1992 | Chu et al. | 257/713 |
| 5,220,804 A | | 6/1993 | Tilton et al. | 62/64 |
| 5,353,865 A | * | 10/1994 | Adiutori et al. | 165/133 |
| 5,609,255 A | | 3/1997 | Pinneo | 428/323 |
| 5,614,140 A | | 3/1997 | Pinneo | 264/81 |
| 5,847,927 A | * | 12/1998 | Minning et al. | 361/696 |
| 5,860,602 A | | 1/1999 | Tilton et al. | 239/548 |
| 6,016,969 A | | 1/2000 | Tilton et al. | 239/1 |
| 6,055,154 A | * | 4/2000 | Azar | 361/704 |
| 6,196,307 B1 | * | 3/2001 | Ozmat | 165/185 |
| 6,411,508 B1 | * | 6/2002 | Kang et al. | 361/695 |

(Continued)

FOREIGN PATENT DOCUMENTS

| | | | | |
|---|---|---|---|---|
| JP | 60136349 A | * | 7/1985 | 165/908 |

(Continued)

OTHER PUBLICATIONS www.ddk.com/Windoows/CVD/thermail%20management.htm, Website Printout, Date Unknown, 1 Page.

(Continued)

*Primary Examiner*—Leonard R Leo
(74) *Attorney, Agent, or Firm*—Michael S. Neustel

(57) ABSTRACT

A diamond foam spray cooling system for improving the thermal management of a heat producing device. The diamond foam spray cooling system includes a thermal management unit including a spray assembly, a chamber, a heat spreader and at least one diamond foam section thermally attached to a cooling surface of the heat spreader. The spray assembly sprays liquid coolant directly upon the engaging surface of the diamond foam section. A portion of the liquid coolant is evaporated from contacting the engaging surface and a portion of the liquid coolant passes into an immersion zone within the diamond foam section. Alternatively, the diamond foam section is thermally attached directly to the heat producing device. The diamond foam section may have varying thicknesses, cavities, raised portions and other configurations.

5 Claims, 6 Drawing Sheets

U.S. PATENT DOCUMENTS

| | | |
|---|---|---|
| 6,667,548 B2 | 12/2003 | O'Connor et al. .......... 257/712 |
| 6,749,931 B1 | 6/2004 | Pinneo et al. ............ 428/319.1 |
| 6,815,052 B2 | 11/2004 | Pinneo .................... 428/319.1 |
| 6,888,720 B2 * | 5/2005 | Pfister et al. ................ 361/689 |
| 6,972,950 B1 * | 12/2005 | Wyatt et al. ................ 361/687 |
| 6,988,534 B2 * | 1/2006 | Kenny et al. .............. 165/80.4 |
| 2002/0141155 A1 | 10/2002 | Pinneo ....................... 361/688 |
| 2003/0071264 A1 | 4/2003 | Davidson .................... 257/77 |
| 2003/0118827 A1 | 6/2003 | Pinneo ....................... 428/408 |

FOREIGN PATENT DOCUMENTS

| | | | |
|---|---|---|---|
| JP | 05343572 A | * 12/1993 | ................ 257/722 |

OTHER PUBLICATIONS www.sumitomoelectricusa.com, Website Printout, Date Unknown, 2 Pages.

www.heat.uta.edu, Website Printout, Date Unknown, 5 Pages.

* cited by examiner

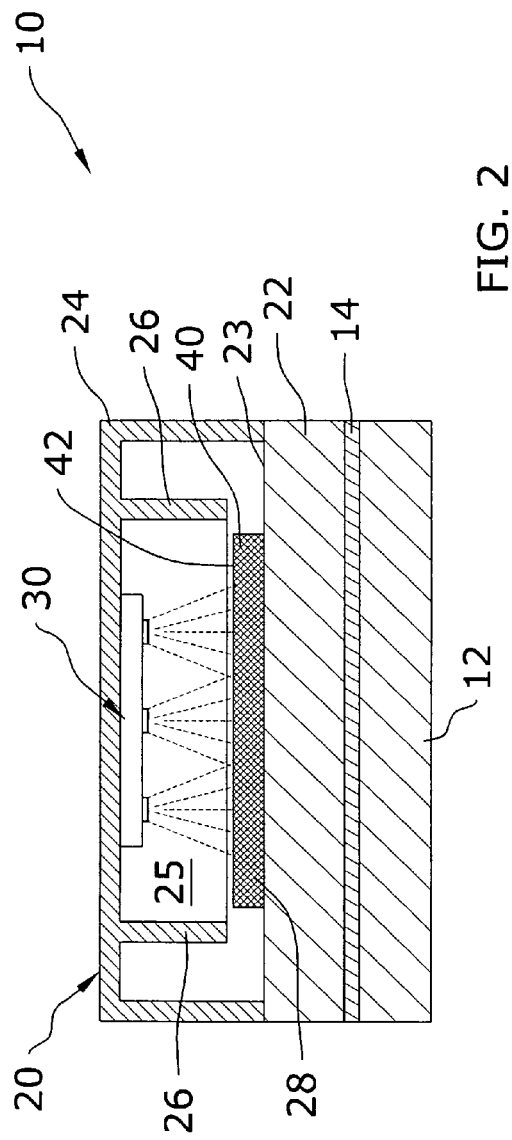
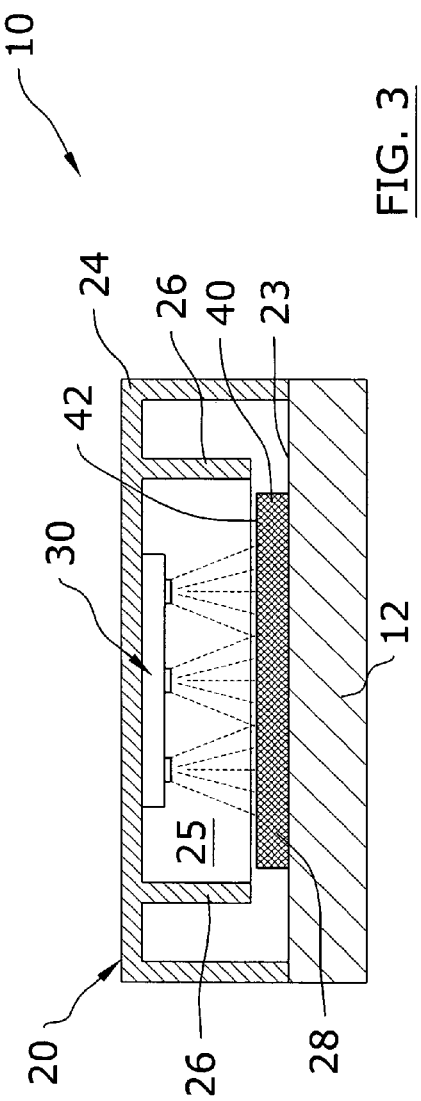

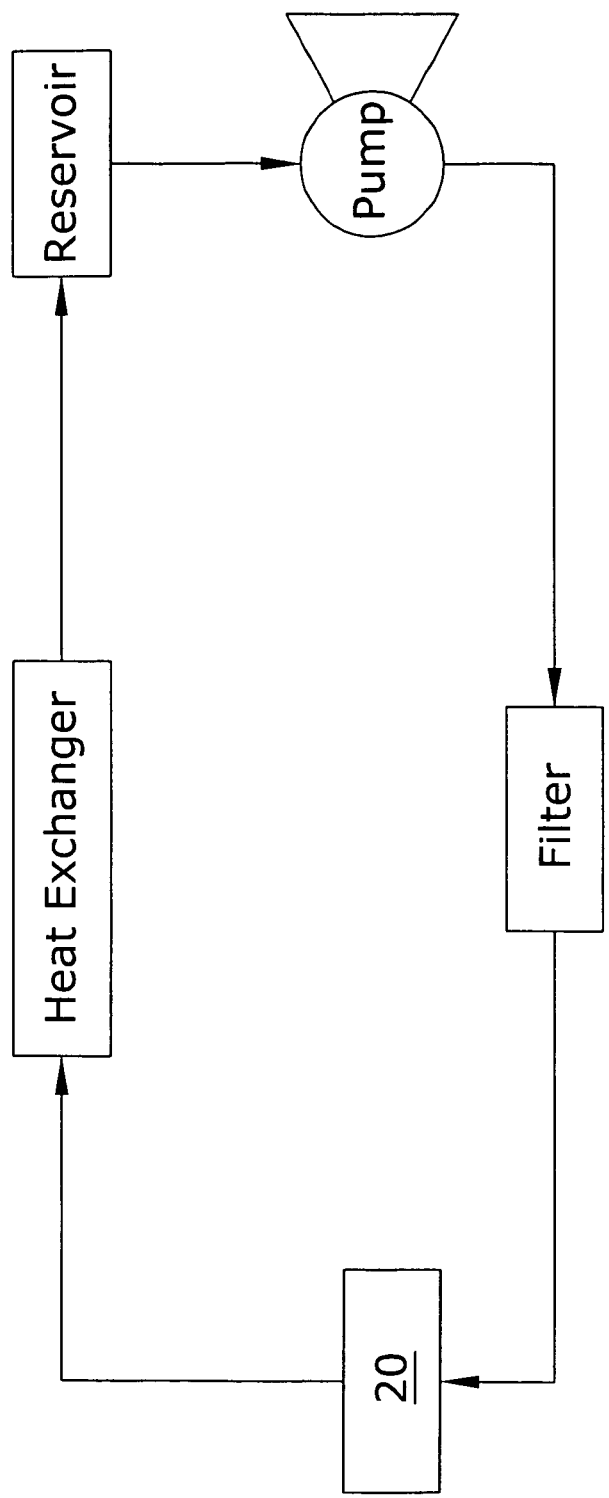

DIAMOND FOAM SPRAY COOLING SYSTEM

CROSS REFERENCE TO RELATED APPLICATIONS

I hereby claim benefit under Title 35, United States Code, Section 119(e) of U.S. provisional patent application Ser. No. 60/540,921 filed Jan. 30, 2004. The 60/540,921 application is currently pending. The 60/540,921 application is hereby incorporated by reference into this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to diamond foam heat sinks and more specifically it relates to a diamond foam spray cooling system for improving the thermal management of a heat producing device.

2. Description of the Related Art

Any discussion of the prior art throughout the specification should in no way be considered as an admission that such prior art is widely known or forms part of common general knowledge in the field.

FIG. 1a illustrates a conventional spray cooling thermal management unit (A) that is comprised of a housing (C) forming a chamber (E) with a heat spreader (B), wherein the heat spreader is thermally attached to a heat producing device (H) by a thermal interface material (G). As further shown in FIG. 1a, a spray assembly (F) within the thermal management unit sprays liquid coolant upon the cooling surface of the heat spreader for thermally managing the heat producing device.

FIG. 1b illustrates another conventional spray cooling thermal management unit (A) that is comprised of a housing (C) forming a chamber (E) connected directly to the heat producing device (H). As further shown in FIG. 1b, the spray assembly (F) within the thermal management unit sprays liquid coolant directly upon the heat producing device.

FIG. 1c illustrates a diamond heat spreading and cooling technique for integrated circuits as disclosed in U.S. Pat. No. 6,667,548. FIG. 1c illustrates a heat producing device (H) with diamond foam (I) directly attached, wherein the diamond foam is thermally attached to a heat spreader (J) by a thermal interface material (G) and wherein a conventional heat sink (K) is attached to the heat spreader.

Natural diamond has a high thermal conductivity of approximately 1,800 watts per meter-Kelvin (W/m-K). Chemical vapor deposition (CVD) processes have been developed to create "diamond foam" that has a polycrystalline structure having a high thermal conductivity approaching that of natural diamond (typically between 1000 to 1800 W/m-K). CVD processes for creating diamond foam are well-known in the art as discussed in U.S. Patent Application Publication No. 2003/0118827 which is hereby incorporated by reference. CVD diamond foam is currently used in traditional heat sinks and heat spreaders in applications such as laser diodes, semiconductors and other heat producing devices. Conventional cooling methods are used to then transfer the conducted heat from the CVD diamond foam such as air cooling as illustrated in U.S. Pat. No. 6,667,548.

While diamond foam may be suitable for traditional heat conductivity applications, diamond foam's heat conductivity is limited by the ability to remove the conducted heat from the diamond foam itself. Hence, there is a need for a thermal management system that efficiently utilizes the unique heat conductivity properties of diamond foam to thermally manage a heat producing device.

BRIEF SUMMARY OF THE INVENTION

In view of the foregoing disadvantages inherent in the known types of diamond foam heat sinks now present in the prior art, the present invention provides a new diamond foam spray cooling system construction wherein the same can be utilized for improving the thermal management of a heat producing device.

The general purpose of the present invention, which will be described subsequently in greater detail, is to provide a new diamond foam spray cooling system that has many of the advantages of the diamond foam heat sinks and heat spreaders mentioned heretofore and many novel features that result in a new diamond foam spray cooling system which is not anticipated, rendered obvious, suggested, or even implied by any of the prior art diamond foam devices, either alone or in any combination thereof.

To attain this, the present invention generally comprises a thermal management unit including a spray assembly, a chamber, a heat spreader and at least one diamond foam section thermally attached to a cooling surface of the heat spreader. The spray assembly sprays liquid coolant directly upon the engaging surface of the diamond foam section. A portion of the liquid coolant is evaporated from contacting the engaging surface and a portion of the liquid coolant passes into an immersion zone within the diamond foam section. Alternatively, the diamond foam section is thermally attached directly to the heat producing device. The diamond foam section may have varying thicknesses, cavities, raised portions and other configurations.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a diamond foam spray cooling system that will overcome the shortcomings of the prior art devices.

A second object is to provide a diamond foam spray cooling system for improving the thermal management of a heat producing device.

Another object is to provide a diamond foam spray cooling system that utilizes spray cooling in combination with diamond foam to increase the thermal conductivity of a thermal management system.

An additional object is to provide a diamond foam spray cooling system that increases the efficiency of spray cooling.

A further object is to provide a diamond foam spray cooling system that utilizes diamond foam as a coolant capacitor during periods of reduced or terminated spraying of liquid coolant.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein:

FIG. 2 is a cross sectional illustration of the present invention wherein the spray assembly sprays liquid coolant upon the diamond foam section which is thermally attached to a heat spreader to form a "cold plate" structure.

FIG. 3 is a cross sectional illustration of the present invention wherein the spray assembly sprays liquid coolant upon the diamond foam section which is thermally attached to the heat producing device for direct spraying.

FIG. 8 is a block diagram of the thermal management unit of the present invention utilized within an exemplary spray cooling system.

DETAILED DESCRIPTION OF THE INVENTION

A. Overview

Figure 1A:
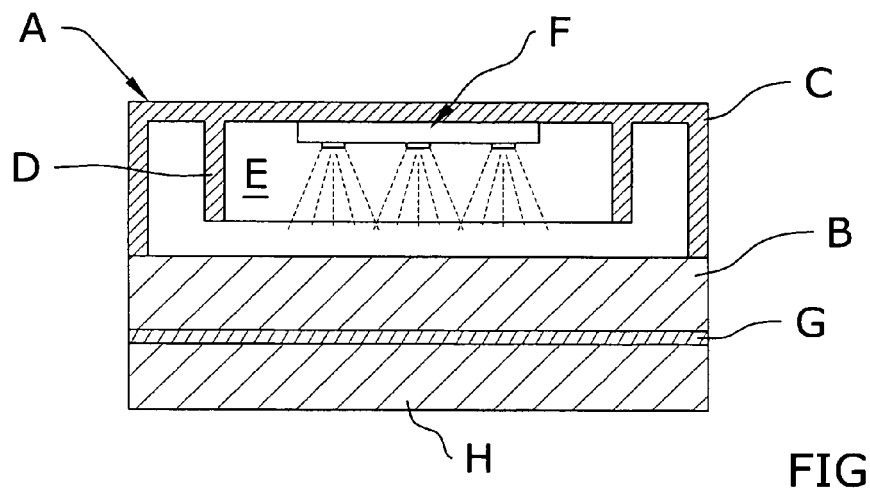
FIG. 1a is a cross-sectional illustration of a conventional spray cooling system.
Figure 1B:
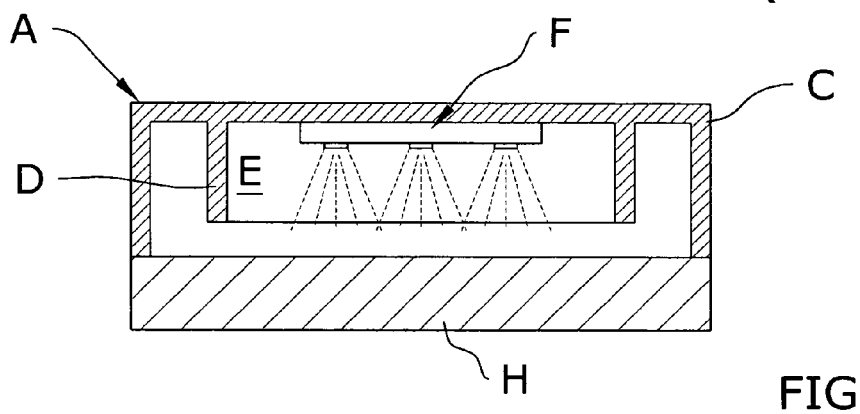
FIG. 1b is a cross-sectional illustration of a conventional spray cooling system spraying coolant directly upon a heat producing device.
Figure 1C:
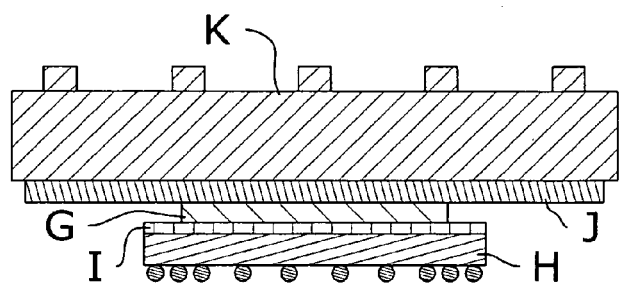
FIG. 1c is a cross-sectional illustration of a conventional diamond foam heat spreading layer being utilized in conjunction with a conventional heat sink as disclosed in U.S. Pat. No. 6,667,548.

Turning now descriptively to the drawings, in which similar reference characters denote similar elements throughout the several views, FIGS. 2 through 8 illustrate a diamond foam spray cooling system 10, which comprises a thermal management unit 20 including a spray assembly 30, a chamber 25, a heat spreader 22 and at least one diamond foam section 40 thermally attached to a cooling surface 23 of the heat spreader 22. The spray assembly 30 sprays liquid coolant directly upon the engaging surface 42 of the diamond foam section 40. A portion of the liquid coolant is evaporated from contacting the engaging surface 42 and a portion of the liquid coolant passes into an immersion zone 44 within the diamond foam section 40. Alternatively, the diamond foam section 40 is thermally attached directly to the heat producing device 12. The diamond foam section 40 may have varying thicknesses, cavities 48, raised portions and other configurations.

B. Thermal Management Unit

Figure 4:
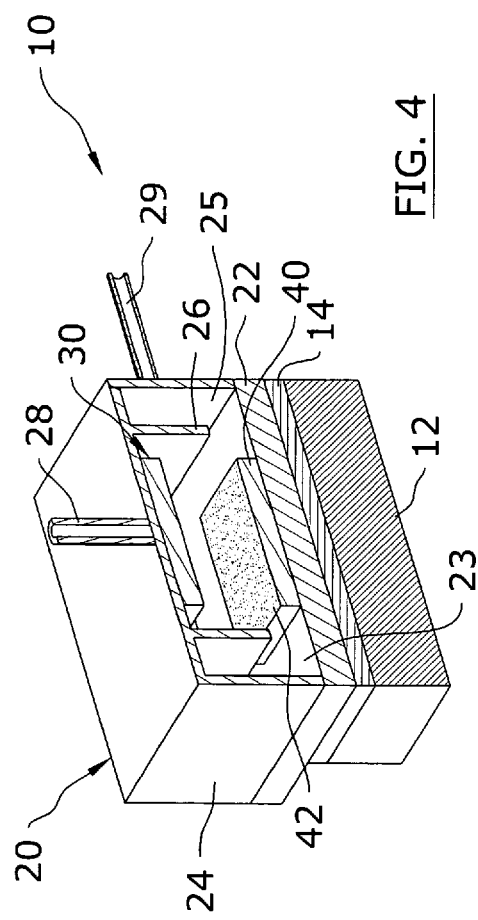
FIG. 4 is a perspective cutaway illustration of the thermal management unit with the diamond foam section attached to a heat spreader.
Figure 5:
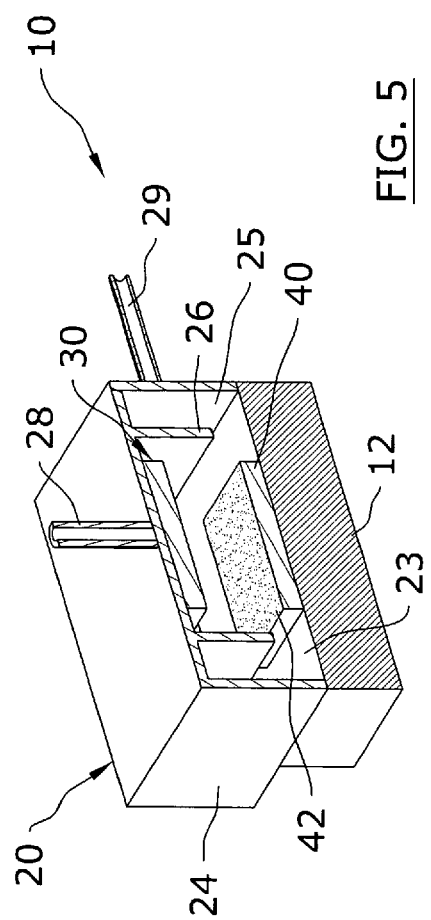
FIG. 5 is a perspective cutaway illustration of the thermal management unit with the diamond foam section attached to the heat producing device.

The thermal management unit 20 preferably includes a spray assembly 30 within a chamber 25 of a housing 24 as shown in FIGS. 2 through 5 of the drawings. FIG. 8 illustrates an exemplary thermal management system suitable for usage with the thermal management unit 20 including a heat exchanger, a reservoir, a pump and a filter all fluidly connected in a closed loop. Even though the thermal management unit 20 is illustrated in the drawings in a local spray cooling structure, the thermal management unit 20 may be comprised of a global spray cooling structure. The liquid coolant that may be utilized in the present invention may be a dielectric (e.g. perfluorinated family) or a non-dielectric (e.g. water). As shown in FIGS. 4 and 5 of the drawings, the thermal management unit 20 preferably has at least one inlet 28 for receiving liquid coolant and at least one outlet 29 for returning liquid coolant within the thermally management system.

The spray assembly 30 is capable of spraying liquid coolant directly upon the engaging surface 42 of the at least one diamond foam section 40 as shown in FIGS. 2 and 3 of the drawings. The spray assembly 30 may be comprised of atomizers, jet orifices, incremental sprayers and other devices capable of spraying liquid coolant in a spray cooling thermal management application which are well-known in the art.

The thermal management unit 20 may be attached in a sealed manner to a heat spreader 22 (FIGS. 2 and 4) or directly to the heat producing device 12 being thermally managed (FIGS. 3 and 5). As shown in FIG. 2, if the thermal management unit 20 is attached to a conventional heat spreader 22 or similar device, a thermal interface material 14 is used to thermally connect the outside of the heat spreader 22 with the heat producing device 12 forming a "cold plate" configuration. The heat spreader 22 may be comprised of various thermally conductive materials such as but not limited to aluminum, copper, diamond or carbon.

As shown in FIG. 3 of the drawings, if no heat spreader 22 is utilized then the housing 24 of the thermal management unit 20 is directly attached to or about the heat producing device 12. It is desirable to perform "direct spraying" since it provides increased thermal efficiency over utilizing a cold plate configuration and allows for spraying multiple sides of the heat producing device 12 (e.g. component package or die).

It is desirable to have a plurality of vapor management protrusions 26 extending within the chamber 25 to redirect the coolant vapor away from the diamond foam section 40 and to maintain the momentum of the coolant droplets 16 as shown in FIGS. 2 through 5 of the drawings. As can be appreciated by one skilled in the art, the thermal management unit 20 may have various other structures and configurations well-known in the thermal management industry. The applicant hereby incorporates by reference the following patents for the purpose of illustrating exemplary spray cooling systems suitable for usage within the present invention: U.S. Pat. No. 5,220,804, U.S. Pat. No. 5,860,602 and U.S. Pat. No. 6,016,969.

C. Diamond Foam Section(s)

As shown in FIGS. 2 through 6 of the drawings, at least one diamond foam section 40 is thermally attached to a cooling surface 23 of a heat spreader 22 and/or a heat producing device 12. The diamond foam section 40 evenly distributes the heat across the area of the cooling surface 23, increases the surface area of the cooling surface 23 and provides for the ability of both immersion cooling and evaporative cooling. The at least one diamond foam section 40 may also be optimized by adjusting the shape (e.g. pin, cone, cylinder, rectangle, cube, etc.), size, thickness and densities.

Diamond foam is desirable because diamond has a thermal conductivity of over 1,000 watts per meter Kelvin (around twenty times greater than silicon and around six times greater than copper). Chemical vapor deposition (CVD) processes have been developed to create diamond foam that has a polycrystalline structure having a high thermal conductivity approaching that of natural diamond (typically between 1000 to 1800 W/m-K). CVD processes for creating diamond foam are well-known in the art as discussed in U.S. Patent Application Publication No. 2003/0118827 which is hereby incorporated by reference.

The at least one diamond foam section 40 may be attached to the cooling surface 23 via various conventional attachment methods (e.g. conductive adhesive 46, thermal interface material 14, directly through chemical vapor deposition, etc.). The diamond foam section 40 may also be directly attached to a thin film of diamond deposited on the cooling surface 23 (not shown). U.S. Patent Publication No. 2003/0071264 is hereby incorporated by reference for the purpose of disclosing bonding and securing methods that are suitable for securing the diamond foam section 40 to the cooling surface 23. The at least one diamond foam section 40 may be comprised of various other structures and materials which have similar heat transfer properties.

Figure 6:
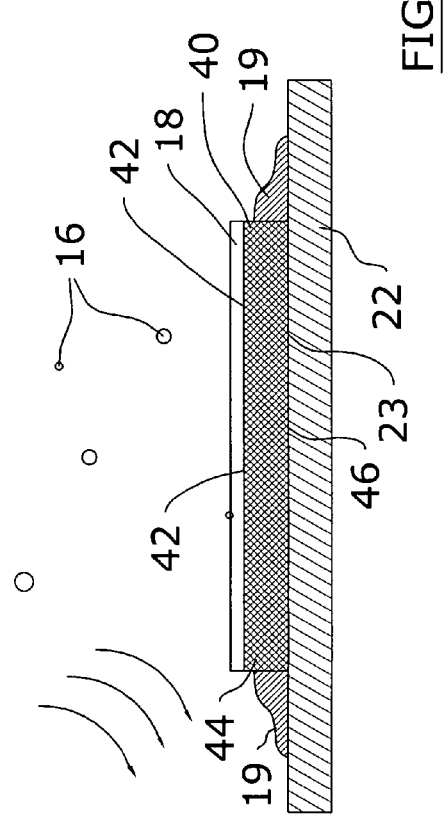
FIG. 6 is a cross sectional illustration of the present invention with the diamond foam section being impinged with sprayed coolant.

The at least one diamond foam section 40 has an engaging surface 42 facing the spray assembly 30 that receives the liquid coolant sprayed by the spray assembly 30 as illustrated in FIGS. 2 and 3 of the drawings. A portion of the liquid coolant is evaporated from contacting the engaging surface 42 and a portion of the liquid coolant passes through the engaging surface 42 into an immersion zone 44 within the diamond foam section 40 as shown in FIG. 6 of the drawings.

The at least one diamond foam section 40 preferably has a varying thickness, wherein the thicker portions may be positioned relative to higher heat flux areas of the cooling surface 23 and thinner portions may be positioned relative to lower heat flux areas of the cooling surface 23. The thicker portions may be positioned relative to a high heat flux zone of the cooling surface 23 to provide additional heat conductivity and also provide a "reservoir" of liquid coolant during periods of reduced liquid coolant flow. The thickness, density, porosity and the engaging surface 42 of the at least one diamond foam section 40 are diamond foam characteristics preferably customized to achieve a substantially uniform temperature across a heat producing device 12. When the heat producing device 12 (e.g. microprocessor) has a relatively substantial uniform temperature throughout, the thermal stresses are thereby reduced and the reliability increased of the heat producing device 12. FIGS. 7b and 7c illustrate some exemplary varying thickness configurations suitable for usage within the present invention. In addition, varying the droplet pitch, droplet size, convergence angles, pressures, droplet velocities and droplet shapes may optimize heat transfer and thermal management of the heat producing device 12.

The density and porosity of the at least one diamond foam section 40 may be adjusted according to the heat transfer requirements of a particularly zone on the cooling surface 23. In addition, the porosity of the at least one diamond foam section 40 may be adjusted wherein the outer portion (e.g. engaging surface 42 has an increased porosity to increase liquid coolant entry and coolant vapor exit.

Figure 7A:
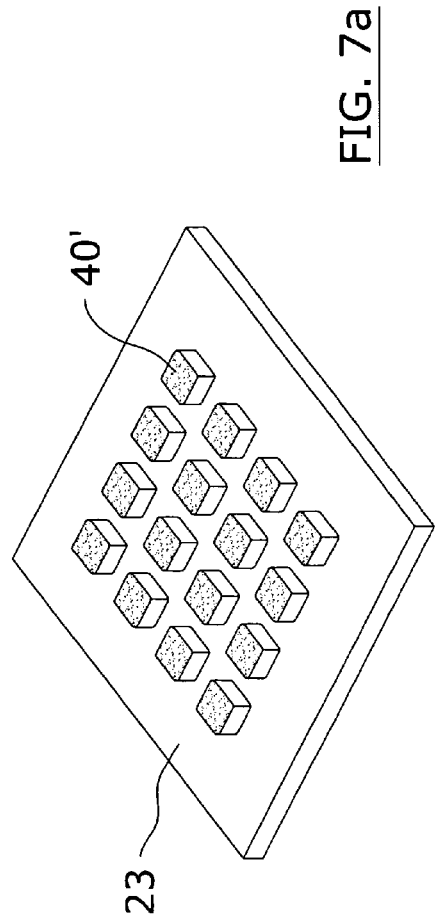
FIG. 7a is a perspective illustration of a plurality of diamond foam sections attached to a cooling surface.
Figure 7B:
FIG. 7b is a perspective illustration of the diamond foam section having a variable thickness.
Figure 7C:
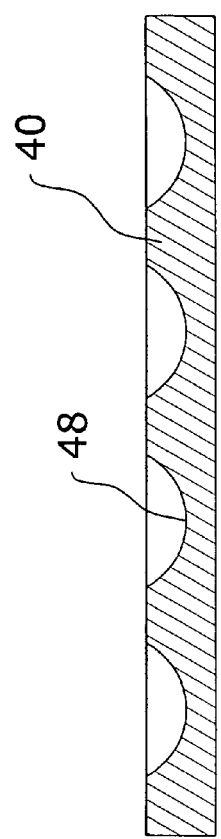
FIG. 7c is a cross sectional illustration of the present invention showing an array of concave surfaces within the diamond foam section.

FIG. 7a illustrates a preferred embodiment of the present invention wherein the at least one diamond foam section 40' is comprised of a plurality of diamond foam sections 40. The plurality of diamond foam sections 40' are distally spaced apart from one another in high heat flux locations wherein the spaces between thereof also form fluid removal paths for facilitating the passage and removal of liquid coolant to allow for increased evaporative cooling. The plurality of diamond foam sections 40' may each have varying thicknesses depending upon the amount of heat flux FIG. 7b illustrates the at least one diamond foam section 40 have a plurality of raised portions extending from the engaging surface 42 and a plurality of recessed portions extending into the engaging surface 42. FIG. 7c illustrates the at least one diamond foam section 40 having a plurality of cavities 48 within the engaging surface 42 that are preferably located coaxially with respect to the spray nozzles of the spray assembly 30 thereby providing a substantially perpendicular droplet contact surface.

D. Operation of Invention

FIGS. 2 and 3 illustrate the thermal management of a heat producing device 12 (e.g. electronic device, microprocessor). As further shown in FIGS. 2 and 3 of the drawings, the spray assembly 30 applies a spray of liquid coolant upon the at least one diamond foam section 40. The at least one diamond foam section 40 thermally conducts the heat from either the heat spreader 22 (FIG. 2) or the heat producing device 12 directly (FIG. 3). The temperature engaging surface 42 of the at least one diamond foam section 40 is thereby raised to a temperature corresponding to the temperature of the heat producing device 12 being thermally managed.

When the liquid coolant droplets 16 engage and impinge the engaging surface 42 of the at least one diamond foam section 40, at least a portion of the liquid coolant is evaporated as shown in FIG. 6 of the drawings. A portion of the liquid coolant may create a coolant film 18 on the engaging surface 42 as shown in FIG. 6 of the drawings. In addition, at least a portion of the liquid coolant penetrates the engaging surface 42 and enters the immersion zone 44 wherein a portion of the same is further evaporated. A portion of the liquid coolant may engage the cooling surface 23 of the heat spreader 22 or the heat producing device 12 creating immersion cooling and/or escape the side portions of the at least one diamond foam section 40 as liquid run out 19 as further shown in FIG. 6 of the drawings. If the volume of liquid coolant being sprayed is reduced, the liquid coolant within the immersion zone 44 acts as a "reservoir" to provide constant liquid coolant to allows for continuous thermal management of the heat producing device 12.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

I claim:

1. A method of thermally managing a heat producing device having at least one diamond foam section thermally attached to said heat producing device, said method comprising the step of:
   spraying a volume of liquid coolant from a spray assembly upon an engaging surface of said at least one diamond foam section, wherein said at least one diamond foam section is thermally connected to a cooling surface of a heat producing device being thermally managed;
   evaporating a portion of said liquid coolant after said volume of liquid coolant engages an engaging surface of said at least one diamond foam section;
   forming a coolant film on said engaging surface of said at least one diamond foam section;
   penetrating a portion of said liquid into an immersion zone within said at least one diamond foam section forming a reservoir of coolant within said at least one diamond foam section; and
   engaging said cooling surface with a portion of said liquid coolant.

2. The method of thermally managing a heat producing device of claim 1, wherein a portion of said liquid coolant that enters said immersion zone exits side portions of said at least one diamond foam section as liquid run out.

3. A method of thermally managing a heat producing device having at least one diamond foam section thermally attached to said heat producing device, said method comprising the step of:
   providing a heat producing device to be thermally managed;
   thermally connecting at least one diamond foam section to a cooling surface of said heat producing device;
   providing a spray assembly comprised of a plurality of atomizers;
   sealing said spray assembly about said at least one diamond foam section;
   spraying a volume of liquid coolant from said plurality of atomizers of said spray assembly upon an engaging surface of said at least one diamond foam section;
   evaporating a portion of said liquid coolant after said volume of liquid coolant engages an engaging surface of said at least one diamond foam section;
   forming a coolant film on said engaging surface of said at least one diamond foam section;
   penetrating a portion of said liquid coolant into an immersion zone within said at least one diamond foam section forming a reservoir of coolant within said at least one diamond foam section;
   engaging said cooling surface with a portion of said liquid coolant; and
   exiting a portion of said liquid from side portions of said at least one diamond foam section.

4. A method of thermally managing a heat producing device having at least one diamond foam section thermally attached to said heat producing device, said method comprising the step of:
   providing a heat producing device to be thermally managed;
   forming at least one first portion of at least one diamond foam section upon a cooling surface of said heat producing device and positioned relative to a first zone of said cooling surface having a high heat flux;
   forming at least one second portion of said at least one diamond foam section upon said cooling surface of said heat producing device and positioned relative to a second zone of said cooling surface having a heat flux lower than said first zone of said cooling surface, wherein said at least one first portion has a thickness greater than said at least one second portion;
   providing a spray assembly comprised of a plurality of atomizers;
   sealing said spray assembly about said at least one diamond foam section;
   spraying a volume of liquid coolant from said plurality of atomizers of said spray assembly upon an engaging surface of said at least one diamond foam section;
   evaporating a portion of said liquid coolant after said volume of liquid coolant engages an engaging surface of said at least one diamond foam section;
   forming a coolant film on said engaging surface of said at least one diamond foam section;
   penetrating a portion of said liquid coolant into an immersion zone within said at least one diamond foam section forming a reservoir of coolant within said at least one diamond foam section;
   engaging said cooling surface with a portion of said liquid coolant; and
   exiting a portion of said liquid from side portions of said at least one diamond foam section.

5. A method of thermally managing a heat producing device having at least one diamond foam section thermally attached to said heat producing device, said method comprising the step of:
   providing a heat producing device to be thermally managed;
   forming at least one first portion of at least one diamond foam section upon a cooling surface of said heat producing device and positioned relative to a first zone of said cooling surface having a high heat flux;
   forming at least one second portion of said at least one diamond foam section upon said cooling surface of said heat producing device and positioned relative to a second zone of said cooling surface having a heat flux lower than said first zone of said cooling surface, wherein said at least one first portion has a thickness greater than said at least one second portion;
   providing a spray assembly comprised of a plurality of atomizers;
   sealing said spray assembly about said at least one diamond foam section;
   spraying a volume of liquid coolant from said plurality of atomizers of said spray assembly upon an engaging surface of said at least one diamond foam section;
   evaporating a portion of said liquid coolant after said volume of liquid coolant engages an engaging surface of said at least one diamond foam section;
   forming a coolant film on said engaging surface of said at least one diamond foam section; and
   penetrating a portion of said liquid coolant into an immersion zone within said at least one diamond foam section forming a reservoir of coolant within said at least one diamond foam section.

* * * * *